(12) United States Patent
Iwamizu

(10) Patent No.: US 11,329,643 B2
(45) Date of Patent: May 10, 2022

(54) DRIVER CIRCUIT AND SEMICONDUCTOR DEVICE

(71) Applicant: FUJI ELECTRIC CO., LTD., Kanagawa (JP)

(72) Inventor: Morio Iwamizu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/940,403

(22) Filed: Jul. 28, 2020

(65) Prior Publication Data

US 2021/0075414 A1 Mar. 11, 2021

(30) Foreign Application Priority Data

Sep. 6, 2019 (JP) .............................. JP2019-163033

(51) Int. Cl.
*H03K 17/082* (2006.01)
*H03K 17/06* (2006.01)
*H03K 17/08* (2006.01)
*H03K 19/00* (2006.01)

(52) U.S. Cl.
CPC ....... *H03K 17/0822* (2013.01); *H03K 17/063* (2013.01); *H03K 19/0027* (2013.01); *H03K 2017/0806* (2013.01)

(58) Field of Classification Search
CPC ............. H03K 17/0822; H03K 17/063; H03K 19/0027; H03K 2017/0806
See application file for complete search history.

(56) References Cited

U.S. PATENT DOCUMENTS

| 5,483,404 A | 1/1996 | Nakano | |
| 6,661,260 B2* | 12/2003 | Nakahara | H03K 17/063 327/109 |
| 7,248,078 B2* | 7/2007 | Mitsuda | H03K 17/0822 326/27 |
| 9,000,811 B2* | 4/2015 | Wang | H03K 17/163 327/108 |

(Continued)

FOREIGN PATENT DOCUMENTS

| JP | H0883909 A | 3/1996 |
| JP | 2009010477 A | 1/2009 |

OTHER PUBLICATIONS

Morisawa Yuka et al., High-Side 2-in-1 "F5114H" for Automobiles, Fuji Electric Review vol. 62—No. 4 2016, p. 261-264.

*Primary Examiner* — Menatoallah Youssef
*Assistant Examiner* — Colleen J O Toole

(57) ABSTRACT

A driver circuit controls an output unit that switches whether or not to supply a current to an output line, in accordance with a potential difference between a first control signal to be input and a voltage of the output line. The driver circuit has a control line transmitting the first control signal to the output unit; a connection switching unit switching whether or not to connect the control line and the output line; a pre-stage control unit that is provided between a high potential line and a low potential line and selects and outputs a potential of any one of the high potential line and the low potential line in accordance with a second control signal; and a post-stage control unit causing the connection switching unit to connect the control line and the output line when the pre-stage control unit outputs a voltage higher than a predetermined threshold value.

16 Claims, 10 Drawing Sheets

(56) References Cited

U.S. PATENT DOCUMENTS

2009/0002055 A1   1/2009  Kojima
2014/0022001 A1*  1/2014  Nakahara .............. H01L 27/088
                                                  327/380

* cited by examiner

DRIVER CIRCUIT AND SEMICONDUCTOR DEVICE

The contents of the following Japanese patent application(s) are incorporated herein by reference:
NO. 2019-163033 filed on Sep. 6, 2019.

BACKGROUND

1. Technical Field

The present invention relates to a driver circuit and a semiconductor device.

2. Related Art

In the related art, known is a driver circuit that drives a power semiconductor such as a MOSFET, an IGBT (insulated gate bipolar transistor) and the like (for example, refer to Patent Documents 1 and 2). The driver circuit comprises a low potential terminal that is connected to a low potential such as a ground potential.

Patent Document 1: Japanese Patent Application Publication No. 2009-10477
Patent Document 2: Japanese Patent Application Publication No. H08-83909

SUMMARY

It is preferably to protect the driver circuit even when a potential that is applied to the low potential terminal varies.

In order to solve the above problem, a first aspect of the present invention provides a driver circuit that controls an output unit that switches whether or not to supply a current to an output line, in accordance with a potential difference between a first control signal to be input and a voltage of the output line. The driver circuit may comprise a control line that transmits the first control signal to the output unit. The driver circuit may comprise a connection switching unit that switches whether or not to connect the control line and the output line. The driver circuit may comprise a pre-stage control unit that is provided between a high potential line and a low potential line and selects and outputs a potential of any one of the high potential line and the low potential line in accordance with a second control signal that is input. The driver circuit may comprise a post-stage control unit that causes the connection switching unit to connect the control line and the output line when the pre-stage control unit outputs a voltage higher than a predetermined threshold value.

The post-stage control unit may be provided between the high potential line and the output line, select a potential of any one of the high potential line and the output line in accordance with a voltage output from the pre-stage control unit, and input the selected potential to the connection switching unit.

The connection switching unit may include an NMOS transistor provided between the control line and the output line. The post-stage control unit may apply a potential of the high potential line to a gate terminal of the NMOS transistor when the pre-stage control unit outputs a voltage higher than the predetermined threshold value.

The post-stage control unit may include inverters of an even number of stages connected in series and provided between the high potential line and the output line.

The pre-stage control unit may select and output a potential of the high potential line when the connection switching unit connects the control line and the output line.

The second control signal may indicate a first logical value when the connection switching unit connects the control line and the output line, and indicate a second logical value when the connection switching unit disconnects the control line and the output line. The pre-stage control unit may output a potential of the high potential line when the second control signal indicates the first logical value, and output a potential of the low potential line when the second control signal indicates the second logical value.

The first logical value may be a logical value H. The pre-stage control unit may include inverters of an even number of stages connected in series and provided between the high potential line and the low potential line.

The driver circuit may further comprise a connection line that inputs an output of the pre-stage control unit to the post-stage control unit. The driver circuit may further comprise a pull-up unit that connects the connection line to a predetermined pull-up potential line.

The pull-up potential line may be the high potential line.

The pull-up unit may include at least one of a current source, a resistor and a depletion type MOS transistor provided between the pull-up potential line and the connection line.

A second aspect of the present invention provides a semiconductor device that comprises an output line, an output unit that switches whether or not to supply a current to the output line in accordance with a potential difference between a first control signal to be input and a voltage of the output line, and the driver circuit of the first aspect.

The summary of the present invention does not necessarily describe all necessary features of the present invention. The present invention may also be a sub-combination of the features described above.

DESCRIPTION OF EXEMPLARY EMBODIMENTS

Hereinafter, the present invention will be described through embodiments of the invention. However, the following embodiments do not limit the invention defined in the claims. Also, all combinations of features described in the embodiments are not necessarily essential to solutions means of the invention.

Figure 1:
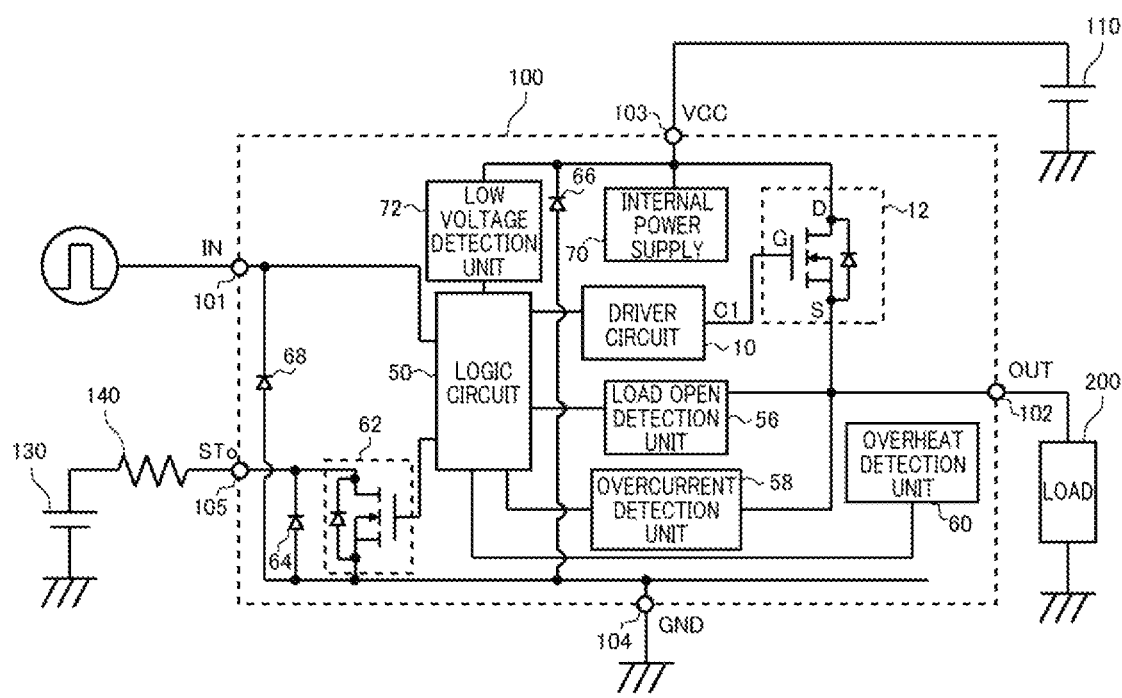
FIG. 1 shows an example of a semiconductor device 100 in accordance with one embodiment of the present invention.

FIG. 1 shows an example of a semiconductor device 100 in accordance with one embodiment of the present invention. The semiconductor device 100 of the present example is a semiconductor chip comprising an input terminal 101, an output terminal 102, a high potential terminal 103 and a low potential terminal 104. The semiconductor device 100 may further comprise a state terminal 105.

The semiconductor device 100 operates in accordance with an input signal IN that is input to the input terminal 101, thereby supplying power to a load 200 connected to the output terminal 102. The input signal IN of the present example may be a signal indicating, with a binary logical value, a case where power is supplied to the load 200 and a case where power is not supplied.

A predetermined high potential VCC is applied to the high potential terminal 103. The high potential terminal 103 of the present example is connected to a power supply 110 that generates the high potential VCC. The low potential terminal 104 is applied with a low potential lower than the high potential VCC. The low potential of the present example is a ground potential GND.

The semiconductor device 100 outputs a state signal STo indicative of an internal state of the semiconductor device 100 from the state terminal 105. The state signal STo may be a signal indicating that an abnormality such as overcurrent is detected. The state terminal 105 may be connected to a pull-up power supply 130 via an external resistor 140. The state signal STo is input to an external processing device. The processing device may control the semiconductor device 100 or another semiconductor device 100, in accordance with the state signal STo. For example, the processing device is connected to a plurality of semiconductor devices 100, and stops power supplying from the plurality of semiconductor devices 100 when an abnormality is detected in any one of the plurality of semiconductor devices 100.

The semiconductor device 100 comprises a driver circuit 10 and an output unit 12. The output unit 12 is connected to the load 200 via the output terminal 102, and supplies power to the load 200. The output unit 12 may be a switching device such as an IGBT, a power MOSFET or the like. The output unit 12 has a control terminal G (for example, gate terminal), and source terminal S and a drain terminal D. The drain terminal D of the present example is connected to the high potential terminal 103, and the source terminal S is connected to the output terminal 102. The output unit 12 switches whether or not to apply the high potential VCC to the load 200, in accordance with a potential difference between a first control signal C1 that is input to the control terminal G and the source terminal S.

The driver circuit 10 inputs to the control terminal G of the output unit 12 the first control signal C1 corresponding to an input signal IN that is input to the input terminal 101. The driver circuit 10 is input with a signal having a potential with respect to a low potential GND. The driver circuit 10 functions as a level shift circuit that level-shifts a signal with respect to the low potential GND to the first control signal C1 with respect to an output potential OUT of the output unit 12. The output potential OUT may also be a potential of the source terminal S of the output unit 12.

The semiconductor device 100 of the present example comprises a logic circuit 50. The logic circuit 50 inputs to the driver circuit 10 a control signal having a logical value pattern corresponding to the input signal IN. The control signal that is output by the logic circuit 50 becomes a potential corresponding to the low potential GND for a logical value L, and becomes a potential corresponding to the high potential VCC for a logical value H. The potential corresponding to the low potential GND may be substantially equal to the low potential GND. The potential corresponding to the high potential VCC may be substantially equal to the high potential VCC.

The logic circuit 50 of the present example controls the driver circuit 10, based on an internal state of the semiconductor device 100. The internal state of the semiconductor device 100 may be a state indicated by at least one parameter of a voltage value, a current value and a resistance value at a predetermined node and a temperature at a predetermined place. The semiconductor device 100 of the present example comprises at least one of a low voltage detection unit 72, a load open detection unit 56, an overcurrent detection unit 58 and an overheat detection unit 60 each of which monitors the internal state of the semiconductor device 100.

The low voltage detection unit 72 detects a voltage value of the high potential VCC of the high potential terminal 103. The low voltage detection unit 72 notifies the logic circuit 50 of an abnormal state when a voltage value of the high potential VCC is below a predetermined reference value.

The load open detection unit 56 detects whether or not the load 200 is connected to the output terminal 102. The load open detection unit 56 may detect whether or not the output terminal 102 is opened, based on an output resistance when a predetermined voltage or current is output from the output terminal 102. The load open detection unit 56 notifies the logic circuit 50 of an abnormal state when it is detected that the load 200 is not connected, in order to prevent the output unit 12 from being in an on state in a state where the load 200 is not connected to the output terminal 102.

The overcurrent detection unit 58 detects a current that is output from the output unit 12. The overcurrent detection unit 58 notifies the logic circuit 50 of an abnormal state when an output current value exceeds a predetermined reference value.

The overheat detection unit 60 detects a temperature at one or more places in the semiconductor device 100. The overheat detection unit 60 notifies the logic circuit 50 of an abnormal state when a temperature at any one place exceeds the predetermined reference value.

The logic circuit 50 controls the output unit 12 to an off state, irrespective of a logical value of the input signal IN, when an abnormal state is notified from any one detection unit. The output unit 12 is controlled to the off state in accordance with the internal state of the semiconductor device 100, so that the semiconductor device 100 can be protected.

The semiconductor device 100 of the present example comprises a state signal output unit 62. The logic circuit 50 causes the state signal output unit 62 to output a predetermined logical value when an abnormal state is notified from any one detection unit. The state signal output unit 62 of the present example is a MOSFET that is connected between the state terminal 105 and the low potential terminal 104. When an abnormal state is notified, the logic circuit 50 inputs a predetermined signal to a gate terminal of the MOSFET, thereby controlling the MOSFET to an off state. In this case, the state signal STo that is output from the state terminal 105 becomes a voltage corresponding to the pull-up power supply 130. When an abnormal state is not notified, the logic circuit 50 controls the MOSFET to an on state. In this case, the state signal STo that is output from the state terminal 105 becomes a voltage corresponding to the low potential GND. Thereby, it is possible to notify the external processing device of the internal state of the semiconductor device 100. The logic circuit 50 may control the on and off states of the MOSFET so as to be opposite to the above example.

The semiconductor device 100 may comprise at least one of a diode 64, a diode 66, and a diode 68. The diode 64 has an anode terminal connected to the low potential terminal 104 and a cathode terminal connected to the state terminal 105. When a voltage of a predetermined value or greater is input to the state terminal 105, the diode 64 connects the state terminal 105 to the low potential terminal 104 to protect the semiconductor device 100.

The diode 66 has an anode terminal connected to the low potential terminal 104 and a cathode terminal connected to the high potential terminal 103. When a voltage of a predetermined value or greater is input to the high potential terminal 103, the diode 64 connects the high potential terminal 103 to the low potential terminal 104 to protect the semiconductor device 100.

The diode 68 has an anode terminal connected to the low potential terminal 104 and a cathode terminal connected to the input terminal 101. When a voltage of a predetermined value or greater is input to the input terminal 101, the diode 64 connects the input terminal 101 to the low potential terminal 104 to protect the semiconductor device 100.

The semiconductor device 100 may comprise an internal power supply 70. The internal power supply 70 is connected to the high potential terminal 103. The internal power supply 70 may generate a power supply voltage that is supplied to each circuit of the semiconductor device 100, in accordance with the high potential VCC. For example, the internal power supply 70 supplies the power supply voltage to each detection unit.

Figure 2:
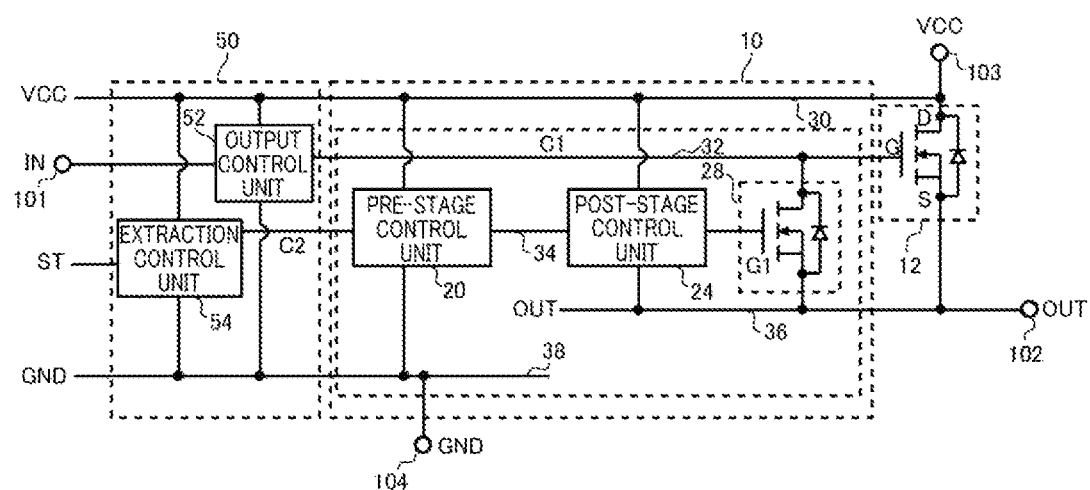
FIG. 2 shows an example of a logic circuit 50, a driver circuit 10 and an output unit 12.

FIG. 2 shows an example of the logic circuit 50, the driver circuit 10 and the output unit 12. The semiconductor device 100 of the present example comprises a high potential line 30 connected to the high potential terminal 103, a low potential line 38 connected to the low potential terminal 104, and an output line 36 connected to the output terminal 102. The output unit 12 of the present example has a drain terminal D connected to the high potential line 30 and a source terminal S connected to the output line 36. The output unit 12 switches whether or not to supply the current to the output line 36, in accordance with a potential difference between the first control signal C1 that is input to the control terminal G and a voltage of the output line 36.

The logic circuit 50 of the present example includes an output control unit 52 and an extraction control unit 54. The output control unit 52 is input with an input signal IN indicative of a timing at which the output unit 12 is shifted to an on or off state. The output control unit 52 of the present example outputs the first control signal C1 that indicates a logical value H when controlling the output unit 12 to an on state and indicates a logical value L when controlling the output unit 12 to an off state. The first control signal C1 has a potential capable of causing the output unit 12 to perform a switching operation. For example, the first control signal C1 is a signal that indicates a potential corresponding to the high potential VCC for the logical value H and indicates a potential corresponding to an output potential OUT for the logical value L. The output control unit 52 may include a charge pump that generates the first control signal C1. An output end of the output control unit 52 and the control terminal G of the output unit 12 are connected by a control line 32. The control line 32 transmits the first control signal C1 to the control terminal G of the output unit 12.

The extraction control unit 54 is input with the state signal ST from a state signal generating unit (not shown) of the logic circuit 50. The state signal generating unit (not shown) of the logic circuit 50 generates the state signal ST indicating that an abnormal state is notified from any one detection unit shown in FIG. 1. A logical value of the state signal ST may be the same as the logical value of the state signal STo described in FIG. 1.

When an abnormal state is detected, the extraction control unit 54 connects the control line 32 and the output line 36, thereby extracting charges of the control terminal G of the output unit 12 to control the output unit 12 to an off state, irrespective of a logical value of the first control signal C1. Thereby, the semiconductor device 100 and the peripheral circuit can be protected. The extraction control unit 54 disconnects the control line 32 and the output line 36 when an abnormal state is not detected.

The extraction control unit 54 of the present example outputs a second control signal C2 that indicates a first logical value when connecting the control line 32 and the output line 36 and indicates a second logical value when disconnecting the control line 32 and the output line 36. The second control signal C2 is a signal that indicates a potential corresponding to the high potential VCC for one logical value and indicates a potential corresponding to the low potential GND for the other logical value.

The driver circuit 10 comprises a control line 32, a pre-stage control unit 20, a post-stage control unit 24, a connection line 34 and a connection switching unit 28. The connection switching unit 28 switches whether or not to connect the control line 32 and the output line 36, based on the second control signal C2 output from the extraction control unit 54. The connection switching unit 28 may be a MOSFET of which a drain terminal is connected to the control line 32 and a source terminal is connected to the output line 36. The connection switching unit 28 switches whether or not to connect the control line 32 and the output line 36, in accordance with a gate signal that is input to a gate terminal G1.

The pre-stage control unit 20 is provided between the high potential line 30 and the low potential line 38, and the high potential VCC and the low potential GND are applied thereto. The pre-stage control unit 20 selects and outputs any one of the high potential VCC and the low potential GND, in accordance with the second control signal C2 that is input. The pre-stage control unit 20 selects the high potential line 30 when the second control signal C2 indicates a first logical value (i.e., the connection switching unit 28 should be controlled to an on state), and selects the low potential line 38 when the second control signal C2 indicates a second logical value (i.e., the connection switching unit 28 should be controlled to an off state). A potential that is output by the pre-stage control unit 20 may be substantially equal to a potential of the selected potential line (in the present example, the high potential VCC or the low potential GND).

The post-stage control unit 24 is provided between the high potential line 30 and the output line 36, and the high potential VCC and the output potential OUT are applied thereto. The post-stage control unit 24 is connected to the pre-stage control unit 20 by the connection line 34. The post-stage control unit 24 selects a potential of any one of the high potential line 30 and the output line 36, in accordance with a voltage output from the pre-stage control unit 20, and applies the selected potential to the gate terminal G1 of the connection switching unit 28. The signal that is applied to the gate terminal G1 by the post-stage control unit 24 is a signal that indicates a potential corresponding to the high potential VCC for one logical value and indicates a potential corresponding to the output potential OUT for the other logical value.

The connection switching unit 28 of the present example is an NMOS transistor. In this case, the post-stage control unit 24 applies the high potential VCC of the high potential line 30 to the gate terminal G1 of the NMOS transistor when the pre-stage control unit 20 outputs a voltage higher than a predetermined threshold value. Thereby, the connection switching unit 28 is controlled to an on state, so that the control line 32 and the output line 36 are connected. For this reason, the output unit 12 is controlled to an off state, regardless of the first control signal C1.

Also, the post-stage control unit 24 applies the output potential OUT of the output line 36 to the gate terminal G1 of the NMOS transistor when the pre-stage control unit 20 outputs a voltage lower than the predetermined threshold value. Thereby, the connection switching unit 28 is controlled to an off state, so that the control line 32 and the output line 36 are disconnected. For this reason, the output unit 12 operates, in accordance with the first control signal C1.

The threshold value may be a threshold value voltage of the inverter provided in the post-stage control unit 24. That is, the post-stage control unit 24 controls the connection switching unit 28 to an on state when the pre-stage control unit 20 outputs a logical value H, and controls the connection switching unit 28 to an off state when the pre-stage control unit 20 outputs a logical value L.

By the above control, when an abnormal state such as overcurrent is detected, the output unit 12 can be controlled to an off state, irrespective of a logical value of the input signal IN. For this reason, the semiconductor device 100 and the peripheral circuit can be protected.

Also, the potential of the low potential GND may rise due to factors such as the low potential terminal 104 being opened. When an open state is formed between the low potential terminal 104 and the ground potential, the potential of the low potential terminal 104 may be pulled up by an internal circuit and the like of the semiconductor device 100. When the potential of the low potential GND rises, both the high potential VCC and the low potential GND that are applied to the pre-stage control unit 20 may become a potential corresponding to a logical value H. In this case, the pre-stage control unit 20 outputs a potential corresponding to a logical value H, irrespective of a logical value of the second control signal C2 that is input from the extraction control unit 54. For this reason, the semiconductor device 100 and the like cannot be protected by controlling the connection switching unit 28 as appropriate, in some cases.

According to the present example, when the pre-stage control unit 20 outputs a logical value H, the post-stage control unit 24 controls the connection switching unit 28 to an on state. For this reason, when the potential of the low potential GND rises and an output of the pre-stage control unit 20 is fixed to the logical value H, the connection switching unit 28 is controlled to an on state and the output unit 12 is controlled to an off state. For this reason, the semiconductor device 100 and the like can be protected.

In the meantime, a circuit disclosed in Patent Document 1 is provided with a potential difference generating circuit between an output terminal and a ground terminal. However, when an inductive component or the like is connected to a load and a potential of the load is deflected negatively, the current flows from the ground terminal toward the output terminal and a ground potential of a peripheral circuit varies. Also, since a circuit disclosed in Patent Document 2 is provided with a plurality of ground terminals, the number of terminals of a chip increases. According to the driver circuit 10 of the present example, it is possible to protect the semiconductor device 100 by a simple configuration.

Figure 3:
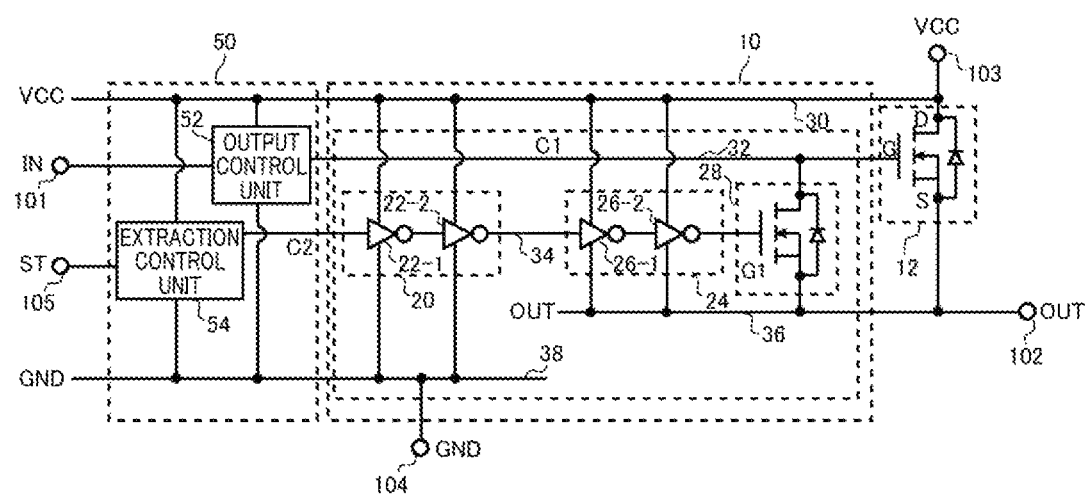
FIG. 3 shows a configuration example of a pre-stage control unit 20 and a post-stage control unit 24.

FIG. 3 shows a configuration example of the pre-stage control unit 20 and the post-stage control unit 24. The post-stage control unit 24 of the present example includes inverters 26 of an even number of stages connected in series. In the example of FIG. 3, the post-stage control unit 24 includes two inverters 26-1 and 26-2. Each of the inverters 26 is provided between the high potential line 30 and the output line 36. Each of the inverters 26 selects and outputs a potential of the output line 36 to a post-stage circuit when an input signal is a logical value H, and selects and outputs a potential of the high potential line 30 to the post-stage circuit when an input signal is a logical value L.

By the above configuration, while operating as a level shift circuit with respect to the output potential OUT, the post-stage control unit 24 can control the connection switching unit 28 to an on state when the pre-stage control unit 20 outputs a logical value H. For this reason, even when the potential of the low potential GND rises, the semiconductor device 100 and the like can be protected. In the meantime, in a case where the connection switching unit 28 is a PMOS transistor, the post-stage control unit 24 may include the inverter 26 of one stage or an odd number of stages.

In the present example, the first logical value of the second control signal C2 is a logical value H, and the second logical value is a logical value L. That is, the second control signal C2 indicates a logical value H when it is necessary to control the connection switching unit 28 to an on state to forcibly control the output unit 12 to an off state, and indicates a logical value L when the connection switching unit 28 is controlled to an off state to operate the output unit 12 in accordance with the first control signal C1.

In this case, the pre-stage control unit 20 includes inverters 26 of an even number of stages connected in series. In the example of FIG. 3, the pre-stage control unit 20 includes two inverters 22-1 and 22-2. Each of the inverters 22 is provided between the high potential line 30 and the low potential line 38. Each of the inverters 22 selects and outputs a potential of the low potential line 38 to a post-stage circuit when an input signal is a logical value H, and selects and outputs a potential of the high potential line 30 to the post-stage circuit when an input signal is a logical value L.

By the above configuration, the pre-stage control unit 20 can output a logical value H when controlling the connection switching unit 28 to an on state. Also, when the potential of the low potential GND rises, an output of the pre-stage control unit 20 is fixed to the logical value H, irrespective of a logical value of the second control signal C2. For this reason, in both cases where an abnormal state such as overcurrent is detected in the semiconductor device 100 and where the potential of the low potential GND rises, the connection switching unit 28 can be controlled to an on state and the output unit 12 can be controlled to an off state. For this reason, the semiconductor device 100 and the like can be protected.

In the meantime, when the first logical value of the second control signal C2 is a logical value L and the second logical value is a logical value H, the pre-stage control unit 20 may include the inverter 22 of one stage or an odd number of stages. Even with the configuration, the pre-stage control unit 20 can output a logical value H when controlling the connection switching unit 28 to an on state. Also, when the potential of the low potential GND rises, an output of the pre-stage control unit 20 is fixed to the logical value H, irrespective of a logical value of the second control signal C2.

Figure 4:
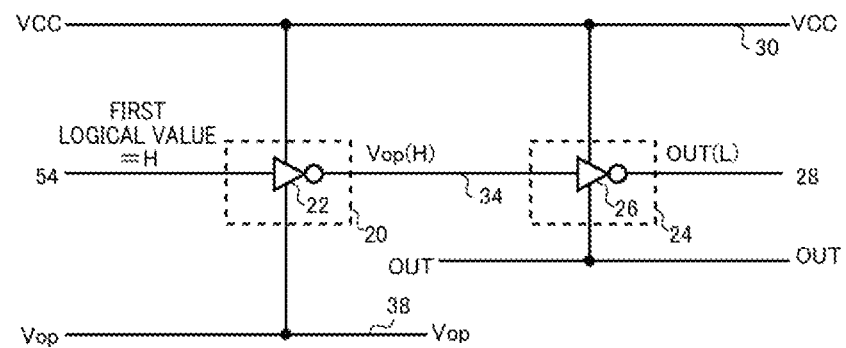
FIG. 4 shows a pre-stage control unit 20 and a post-stage control unit 24 in accordance with Comparative Example.

FIG. 4 shows a pre-stage control unit 20 and a post-stage control unit 24 in accordance with Comparative Example. In the present example, a first logical value that is output from the extraction control unit 54 is a logical value H, and the connection switching unit 28 is an NMOS transistor. Also, the pre-stage control unit 20 includes one inverter 22, and the post-stage control unit 24 includes one inverter 26. Also, the low potential terminal 104 is in an open state, and the low potential line 38 is applied with an open potential Vop corresponding to a logical value H.

In the present example, a case where the extraction control unit 54 outputs a logical value H so as to control the connection switching unit 28 to an on state is described. The inverter 22 of the pre-stage control unit 20 selects and outputs a potential of the low potential line 38 (the low potential GND at normal times), in accordance with an input logical value H. However, since the low potential line 38 of the present example is applied with the open potential Vop corresponding to a logical value H, an output of the inverter 22 becomes a logical value H.

When the pre-stage control unit 20 outputs a logical value H, the post-stage control unit 24 outputs the output potential OUT of the output line 36. For this reason, the connection switching unit 28 becomes off, so that the output unit 12 cannot be forcibly controlled to an off state. For this reason, even when overcurrent or the like is detected, the current is continuously output from the output unit 12, so that it is difficult to protect the semiconductor device 100 and the like.

FIGS. 5 to 8 illustrate operation examples of the pre-stage control unit 20 and the post-stage control unit 24 in accordance with the embodiment. In FIGS. 5 to 8, the frame lines and reference signs of the pre-stage control unit 20 and the post-stage control unit 24 are omitted, and the two inverters 22 and the two inverters 26 are only shown. Also, in the examples of FIGS. 5 to 8, the first logical value that is output by the extraction control unit 54 is a logical value H and the connection switching unit 28 is an NMOS transistor.

Figure 5:
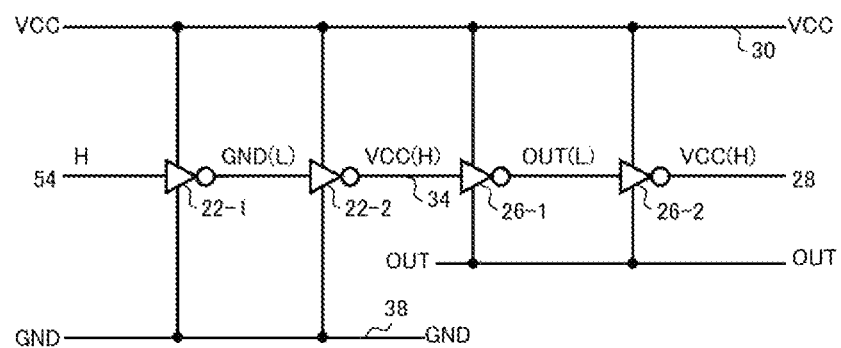
FIG. 5 shows an operation example when a low potential GND is applied to a low potential line 38 and an extraction control unit 54 outputs a logical value H.

FIG. 5 shows an operation example when the low potential GND is applied to the low potential line 38 and the extraction control unit 54 outputs a logical value H. In this case, the inverter 22-1 selects and outputs the low potential GND (corresponding to a logical value L) of the low potential line 38, in accordance with an input logical value H. The inverter 22-2 selects and outputs the high potential VCC (corresponding to a logical value H) of the high potential line 30, in accordance with an input logical value L.

The inverter 26-1 selects and outputs the output potential OUT (corresponding to a logical value L) of the output line 36, in accordance with an input logical value H. The inverter 26-2 selects and outputs the high potential VCC (corresponding to a logical value H) of the high potential line 30, in accordance with an input logical value L. Thereby, the connection switching unit 28 is controlled to an on state, and the output unit 12 is forcibly controlled to an off state.

Figure 6:
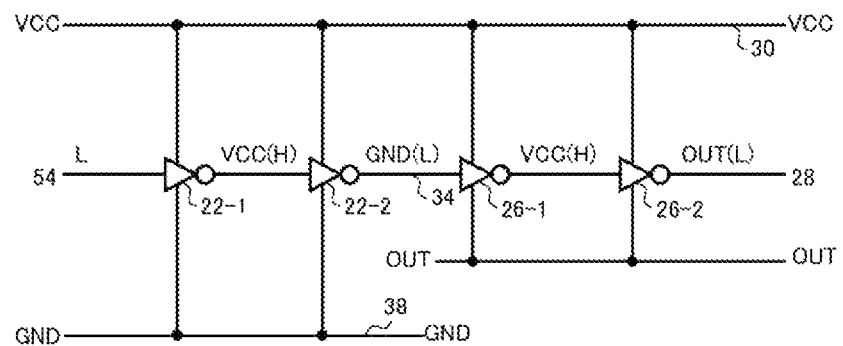
FIG. 6 shows an operation example when the low potential GND is applied to the low potential line 38 and the extraction control unit 54 outputs a logical value L.

FIG. 6 shows an operation example when the low potential GND is applied to the low potential line 38 and the extraction control unit 54 outputs a logical value L. In this case, the inverter 22-1 selects and outputs the high potential VCC (corresponding to a logical value H) of the high potential line 30, in accordance with an input logical value L. The inverter 22-2 selects and outputs the low potential GND (corresponding to a logical value L) of the low potential line 38, in accordance with an input logical value H.

The inverter 26-1 selects and outputs the high potential VCC (corresponding to a logical value H) of the high potential line 30, in accordance with an input logical value L. The inverter 26-2 selects and outputs the output potential OUT (corresponding to a logical value L) of the output line 36, in accordance with an input logical value H. Thereby, the connection switching unit 28 is controlled to an off state, and the output unit 12 operates in accordance with the first control signal C1.

Figure 7:
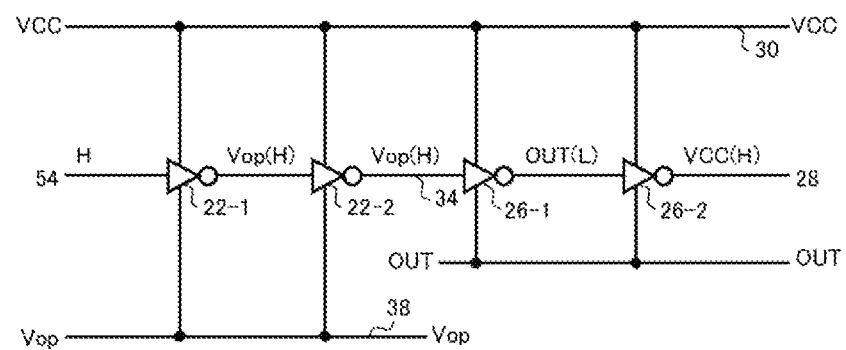
FIG. 7 shows an operation example when an open potential Vop corresponding to a logical value H is applied to the low potential line 38 and the extraction control unit 54 outputs a logical value H.

FIG. 7 shows an operation example when an open potential Vop corresponding to a logical value H is applied to the low potential line 38 and the extraction control unit 54 outputs a logical value H. In this case, the inverter 22-1 selects and outputs the open potential Vop (corresponding to a logical value H) of the low potential line 38, in accordance with an input logical value H. The inverter 22-2 selects and outputs the open potential Vop (corresponding to a logical value H) of the low potential line 38, in accordance with an input logical value H.

The inverter 26-1 selects and outputs the output potential OUT (corresponding to a logical value L) of the output line 36, in accordance with an input logical value H. The inverter 26-2 selects and outputs the high potential VCC (corresponding to a logical value H) of the high potential line 30, in accordance with an input logical value L. Thereby, the connection switching unit 28 is controlled to an on state, and the output unit 12 is forcibly controlled to an off state.

Figure 8:
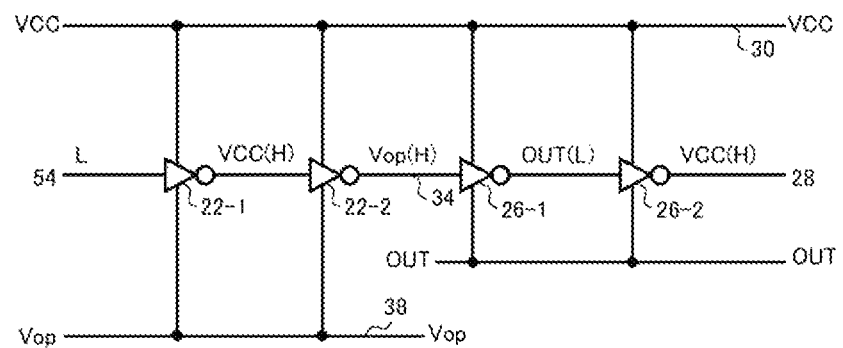
FIG. 8 shows an operation example when an open potential Vop corresponding to a logical value H is applied to the low potential line 38 and the extraction control unit 54 outputs a logical value L.

FIG. 8 shows an operation example when the open potential Vop corresponding to a logical value H is applied to the low potential line 38 and the extraction control unit 54 outputs a logical value L. In this case, the inverter 22-1 selects and outputs the high potential VCC (corresponding to a logical value H) of the high potential line 30, in accordance with an input logical value L. The inverter 22-2 selects and outputs the open potential Vop (corresponding to a logical value H) of the low potential line 38, in accordance with an input logical value H.

The inverter 26-1 selects and outputs the output potential OUT (corresponding to a logical value L) of the output line 36, in accordance with an input logical value H. The inverter 26-2 selects and outputs the high potential VCC (corresponding to a logical value H) of the high potential line 30, in accordance with an input logical value L. Thereby, the connection switching unit 28 is controlled to an on state, and the output unit 12 is forcibly controlled to an off state.

By the operations described in FIGS. 5 to 8, the connection switching unit 28 can be controlled to an on state and the output unit 12 can be controlled to an off state in both cases where an abnormal state such as overcurrent is detected in the semiconductor device 100 and where the potential of the low potential GND rises. For this reason, the semiconductor device 100 and the like can be protected.

Figure 9:
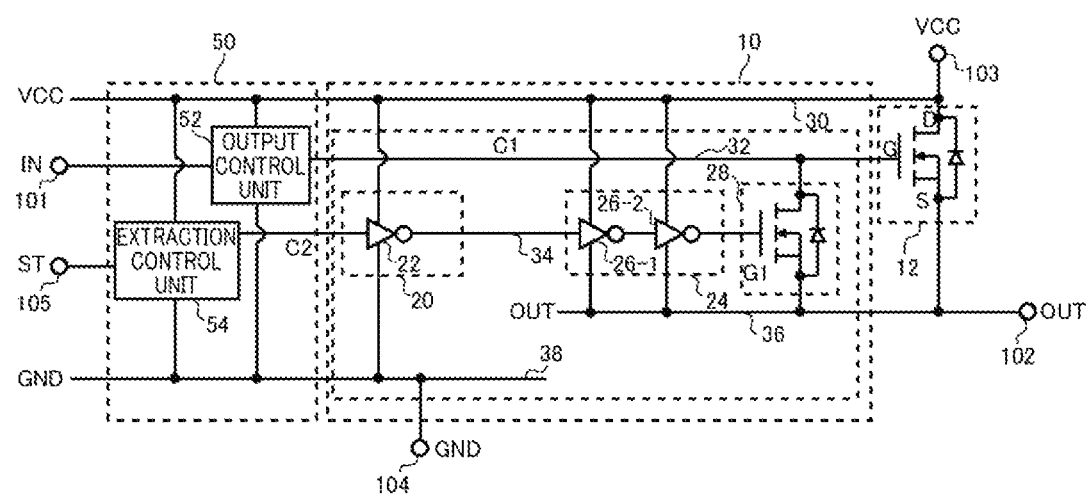
FIG. 9 shows another configuration example of the pre-stage control unit 20.

FIG. 9 shows another example of the pre-stage control unit 20. The extraction control unit 54 of the present example outputs a logical value L as the first logical value, and outputs a logical value H as the second logical value. In this case, the pre-stage control unit 20 includes the inverter 22 of one stage or an odd number of stages. Thereby, when the first logical value is input to the pre-stage control unit 20, the pre-stage control unit 20 can output a voltage corresponding to a logical value H. The semiconductor device 100 may comprise the same configuration as any one of the aspects described in FIGS. 1 to 8, for the configurations except the pre-stage control unit 20. Even with the configuration, the semiconductor device 100 and the like can be protected.

Figure 10:
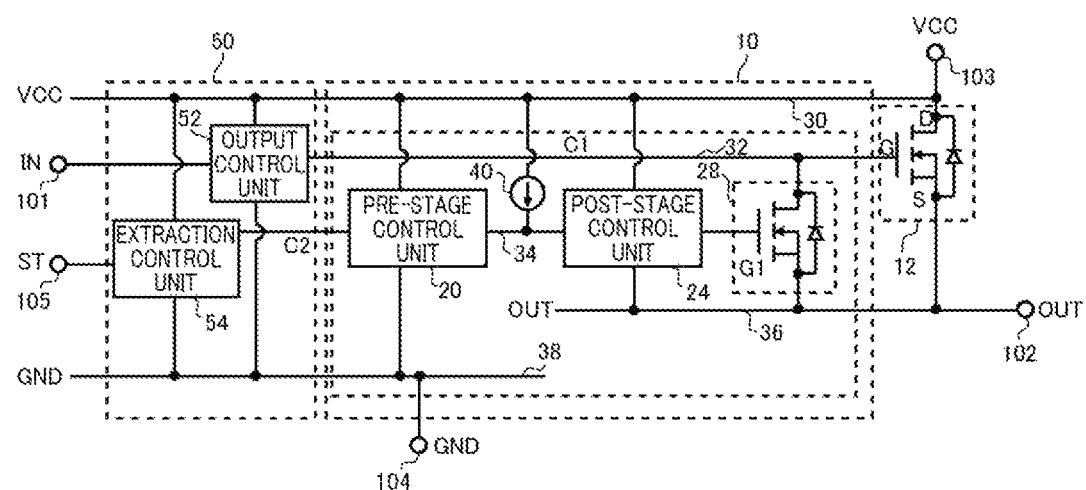
FIG. 10 shows another configuration example of the driver circuit 10.

FIG. 10 shows another configuration example of the driver circuit 10. The driver circuit 10 of the present example is different from the driver circuit 10 described in FIGS. 1 to 9, in that a pull-up unit 40 is provided. The configuration except the pull-up unit 40 is the same as the driver circuit 10 in any one of the aspects described in FIGS. 1 to 9.

The pull-up unit 40 connects the connection line 34 to a predetermined pull-up potential line. The pull-up potential line is a potential line to which a potential higher than the low potential GND is applied. The pull-up potential line is applied with a potential higher than the threshold value voltage of the inverter 26. In the present example, the high potential line 30 functions as the pull-up potential line.

The pull-up unit 40 is provided, so that it is possible to pull up a potential of the connection line 34 to a potential of the pull-up potential line. Thereby, even when the potential of the low potential line 38 rises, the connection switching unit 28 can be easily controlled to an on state. For example, when the potential of the low potential line 38 rises near the threshold value voltage of the inverter 26 in the post-stage control unit 24, an operation of the inverter 26 may become unstable. According to the present example, since the potential of the connection line 34 is pulled up, when the potential of the low potential line 38 rises near the threshold value voltage of the inverter 26, the potential that is input to the post-stage control unit 24 is set higher than the threshold value voltage of the inverter 26, so that the operation of the inverter 26 can be stabilized.

The pull-up unit 40 may include at least one of a current source, a resistor and a depletion type MOS transistor. The current source defines a current that flows from the high potential line 30 toward the connection line 34. The resistor has one end connected to the high potential line 30 and the other end connected to the connection line 34. The depletion type MOS transistor has a drain terminal connected to the high potential line 30 and a source terminal connected to the connection line 34 and the gate terminal. The pull-up unit 40 may have another structure.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 10 driver circuit
12 output unit
20 pre-stage control unit
22 inverter
24 post-stage control unit
26 inverter
28 connection switching unit
30 high potential line
32 control line
34 connection line
36 output line
38 low potential line
40 pull-up unit
50 logic circuit
52 output control unit
54 extraction control unit
56 load open detection unit
58 overcurrent detection unit
60 overheat detection unit
62 state signal output unit
64, 66, 68 diode
70 internal power supply
72 low voltage detection unit
100 semiconductor device
101 input terminal
102 output terminal
103 high potential terminal
104 low potential terminal
105 state terminal
110 power supply
130 pull-up power supply
140 external resistor
200 load

What is claimed is:

1. A driver circuit that controls an output unit that switches whether or not to supply a current to an output line, in accordance with a potential difference between a first control signal to be input and a voltage of the output line, the driver circuit comprising:
   a control line that transmits the first control signal to the output unit;
   a connection switching unit that switches whether or not to connect the control line and the output line;
   a pre-stage control unit that is provided between a high potential line and a low potential line and selects and outputs a potential of any one of the high potential line and the low potential line in accordance with a second control signal that is input, the high potential line being directly connected to the output unit, wherein
   when the potential of the low potential line rises, the pre-stage control unit outputs the potential of the low potential line irrespective of the second control signal input thereto; and
   a post-stage control unit that is connected to the high potential line and the output line and causes the connection switching unit to connect the control line and the output line when the pre-stage control unit outputs a voltage higher than a predetermined threshold value; wherein
   the post-stage control unit is provided between the high potential line and the output line and includes inverters of an even number of stages connected in series.

2. The driver circuit according to claim 1, wherein
   the post-stage control unit is provided between the high potential line and the output line, selects a potential of any one of the high potential line and the output line, in accordance with a voltage output from the pre-stage control unit, and inputs the selected potential to the connection switching unit.

3. The driver circuit according to claim 2, wherein
   the connection switching unit includes an NMOS transistor provided between the control line and the output line, and
   the post-stage control unit applies a potential of the high potential line to a gate terminal of the NMOS transistor when the pre-stage control unit outputs a voltage higher than the predetermined threshold value.

4. The driver circuit according to claim 1, wherein
the pre-stage control unit selects and outputs a potential of the high potential line when the connection switching unit connects the control line and the output line.

5. The driver circuit according to claim 1, wherein
the second control signal indicates a first logical value when the connection switching unit connects the control line and the output line, and indicates a second logical value when the connection switching unit disconnects the control line and the output line, and
the pre-stage control unit outputs a potential of the high potential line when the second control signal indicates the first logical value, and outputs a potential of the low potential line when the second control signal indicates the second logical value.

6. The driver circuit according to claim 5, wherein the first logical value is a logical value H, and the pre-stage control unit is provided between the high potential line and the low potential line and includes inverters of an even number of stages connected in series.

7. The driver circuit according to claim 1, comprising:
a connection line that inputs an output of the pre-stage control unit to the post-stage control unit; and
a pull-up unit that connects the connection line to a predetermined pull-up potential line.

8. The driver circuit according to claim 7, wherein the pull-up potential line is the high potential line.

9. The driver circuit according to claim 7, wherein
the pull-up unit includes at least one of a current source, a resistor and a depletion type MOS transistor provided between the pull-up potential line and the connection line.

10. A semiconductor device comprising:
an output line;
an output unit that switches whether or not to supply a current to the output line in accordance with a potential difference between a first control signal to be input and a voltage of the output line; and
the driver circuit according to claim 1.

11. A driver circuit that controls an output unit that switches whether or not to supply a current to an output line, in accordance with a potential difference between a first control signal to be input and a voltage of the output line, the driver circuit comprising:
a control line that transmits the first control signal to the output unit;
a connection switching unit that switches whether or not to connect the control line and the output line;
a pre-stage control unit that is provided between a high potential line and a low potential line and selects and outputs a potential of any one of the high potential line and the low potential line in accordance with a second control signal that is input, the low potential line being connected to a ground potential, wherein
when the potential of the low potential line rises, the pre-stage control unit outputs the potential of the low potential line irrespective of the second control signal input thereto; and
a post-stage control unit that causes the connection switching unit to connect the control line and the output line when the pre-stage control unit outputs a voltage higher than a predetermined threshold value, wherein the post-stage control unit is provided between the high potential line and the output line and includes inverters of an even number of stages connected in series, wherein
when an open state is formed between the low potential line and the ground potential, the pre-stage control unit outputs a voltage that is higher than a predetermined threshold value.

12. A driver circuit that controls an output unit that switches whether or not to supply a current to an output line, in accordance with a potential difference between a first control signal to be input and a voltage of the output line, the driver circuit comprising:
a control line that transmits the first control signal to the output unit;
a connection switching unit that switches whether or not to connect the control line and the output line;
a pre-stage control unit that refers to a potential of a low potential line as a reference potential and outputs the potential of the low potential line irrespective of a second control signal that is input thereto when the potential of the low potential line rises; and
a post-stage control unit that refers to the potential of the output potential line as a reference potential and causes the connection switching unit to connect the control line and the output line when the pre-stage control unit outputs a voltage higher than a predetermined threshold value, wherein
the post-stage control unit includes inverters of an even number of stages connected in series that refer to the potential of the output line as a reference potential.

13. The driver circuit according to claim 12, wherein
the connection switching unit includes an NMOS transistor provided between the control line and the output line.

14. The driver circuit according to claim 12, wherein
the second control signal indicates a first logical value when the connection switching unit connects the control line and the output line, and indicates a second logical value when the connection switching unit disconnects the control line and the output line, and
the pre-stage control unit outputs the potential of the low potential line when the second control signal indicates the second logical value.

15. The driver circuit according to claim 14, wherein
the first logical value is a logical value H, and
the pre-stage control unit includes inverters of an even number of stages connected in series that refer to the potential of the low potential line as a reference potential.

16. A driver circuit that controls an output unit that switches whether or not to supply a current to an output line, in accordance with a potential difference between a first control signal to be input and a voltage of the output line, the driver circuit comprising:
a control line that transmits the first control signal to the output unit;
a connection switching unit that switches whether or not to connect the control line and the output line;
a pre-stage control unit that refers to a potential of a low potential line as a reference potential, the low potential line being connected to a ground potential, wherein
when the potential of the low potential line rises, the pre-stage control unit outputs the potential of the low potential line irrespective of a second control signal input thereto; and a post-stage control unit that causes the connection switching unit to connect the control line and the output line when the pre-stage control unit outputs a voltage higher than a predetermined threshold value, wherein output line and includes inverters of an even number of stages connected in series, wherein when an open state is formed between the low potential line and the ground potential, the pre-stage control unit outputs a voltage that is higher than a predetermined threshold value.

* * * * *